United States Patent [19]

May

[11] Patent Number: 4,682,131
[45] Date of Patent: Jul. 21, 1987

[54] HIGH-Q RF FILTER WITH PRINTED CIRCUIT BOARD MOUNTING TEMPERATURE COMPENSATED AND IMPEDANCE MATCHED HELICAL RESONATORS

[75] Inventor: Colin J. May, Sassafras, Australia

[73] Assignee: Motorola Inc., Schaumburg, Ill.

[21] Appl. No.: 742,502

[22] Filed: Jun. 7, 1985

[51] Int. Cl.$^4$ .............................................. H01P 1/20
[52] U.S. Cl. ..................................... 333/202; 333/33; 333/219; 333/234; 333/235; 334/41; 334/45
[58] Field of Search ............... 333/202, 204, 206, 207, 333/229, 234, 175, 176, 235, 219; 334/45, 41

[56] References Cited

U.S. PATENT DOCUMENTS

| | | | |
|---|---|---|---|
| 3,173,111 | 3/1965 | Kallmann | 333/162 |
| 3,247,475 | 4/1966 | Buetow et al. | 333/231 |
| 3,840,828 | 10/1974 | Linn et al. | 333/204 X |
| 3,936,776 | 2/1976 | Sundquist | 333/202 |
| 3,970,972 | 7/1976 | Bunner | 333/234 |
| 4,205,286 | 5/1980 | Parish | 333/234 X |
| 4,210,884 | 7/1980 | Tabuchi et al. | 333/203 |
| 4,342,969 | 8/1987 | Myers et al. | 333/33 |
| 4,361,821 | 6/1982 | Dubovsky et al. | 333/202 X |
| 4,422,059 | 12/1983 | Fuji et al. | 333/202 |
| 4,459,571 | 7/1984 | Fraser | 333/202 |
| 4,477,785 | 10/1984 | Atia | 333/202 |

FOREIGN PATENT DOCUMENTS 0024201 2/1983 Japan .................................. 333/219

Primary Examiner—Eugene R. LaRoche
Assistant Examiner—Benny Lee
Attorney, Agent, or Firm—Donald B. Southard; James W. Gillman

[57] ABSTRACT

A helical filter is disclosed which includes a ground plane having microstrip transmission line segments to which a respective helical resonator coil is connected at the high impedance end thereof. A discrete capacitor is connected in parallel with each transmission line. A housing is provided with individual resonator compartments which effect associated distributed capacitance with the resonators themselves, which capacitance may be adjusted by included tuning screws. Conductors are connected to and form an integral part of a given two of said transmission lines and serve as the input and output for the helical filter. The transmission line and discrete capacitor pair provides the necessary impedance match, while the capacitor itself facilitates temperature compensation and frequency range selection.

13 Claims, 5 Drawing Figures

HIGH-Q RF FILTER WITH PRINTED CIRCUIT BOARD MOUNTING TEMPERATURE COMPENSATED AND IMPEDANCE MATCHED HELICAL RESONATORS

BACKGROUND OF THE INVENTION

The present invention generally relates to bandpass helical filters and, more particularly, to a high-Q, RF, helical filter arrangement utilizing microstrip transmission lines formed on a printed circuit board and having provision for temperature compensation as well as changing the selected frequency range of the filter arrangement.

Helical filters of the type having one or more resonators are, of course, known in the art. Typically, these filter arrangements include a plurality of resonators, or helical coils, encircling a cylindrical core of non-conducting material which are mounted on a suitable rigid base plate. The helical coils themselves are connected to ground at one end only. A tuning slug, threadably received in a top location of an included housing, is adjustable in position with respect to the open end of the helical coil so as to effect a change in the tuning thereof. The coils themselves are included in separate formed compartments within the housing which may be intercoupled by way of apertures in the compartment side walls. It is necessary that there be at least two such helical resonators so that appropriate input and output connections may be provided. A typical filter arrangement comprises three such resonators, the center resonator being coupled to the two end resonators by the referenced apertures in the compartment side walls. It has been customary in the past that the input and output connections be made at a "tap" point on the associated helical resonators for purposes of providing the desired impedance match to the circuit to which the filter arrangement is connected.

One known improvement, directed to just the impedance matching concerns of the filter arrangement, is described in U.S. Pat. No. 4,342,969 to Myers et al., which discloses a way of eliminating the commonly used "tap" on the end helical resonators by providing for each resonator a planar microstrip stub which exhibits an inductive impedance at the resonant frequency of the helical resonator. A summary of such an arrangement is given in column 1, lines 47–68 and column 2, lines 1–13. While such an arrangement does indeed provide an improved impedance match, it does nothing to temperature compensate the overall resonator.

Temperature compensation is necessary because the helical coil expands and contracts with respect to the housing. Moreover, the materials used for the housing and tuning screws expand and contract with changes in temperature. This relative movement between the helical coil and its associated tuning slug threadably held by the housing upsets the electrical tuning thereof.

Prior art structures have commonly effected overall temperature compensation by making use of different materials for each of the constituent parts within the entire filter. By utilizing materials specially chosen for each of the insulating coil forms, the housing, and the tuning slugs, the overall temperature coefficient required for the entire filter is achieved. These materials usually are more exotic and, therefore, more expensive.

Furthermore, if a frequency range change is desired for a given filter, the physical parameters such as coil electrical length and the specific means of input/output impedance matching would have to be modified to restore the desired temperature compensation characteristics. This is a serious disadvantage even when the input/output impedance matching is accomplished by means of a microstrip transmission line on a printed circuit board. So, although the need to effect a change in the coil electrical length may be obviated, this need is transferred upon the microstrip transmission line length to accommodate a desired change in frequency range.

Accordingly, there exists a need for a further improvement in the performance of a helical filter such that it is easily temperature compensated and does not require changes in either coil length or microstrip transmission line length to accommodate a desired change in frequency range.

SUMMARY OF THE INVENTION

It is an object of the present invention to provide a bandpass helical filter which overcomes the foregoing deficiencies.

It is a further object of the present invention to provide a bandpass helical filter of the foregoing type and which exhibits an improved impedance match to the circuit in which it is intended to operate while being effectively temperature compensated as well as able to accommodate a desired change in frequency range.

In practicing the invention, an improved bandpass helical filter arrangement is provided which includes a ground plane, such as a PC board, which in turn includes a plurality of segments, each forming a microstrip transmission line, and a plurality of corresponding helical resonators each having one end connected to the high impedance end of an associated microstrip transmission line. Each microstrip transmission line includes an associated capacitor connected in parallel therewith. The resonators at the respective end positions of the filter arrangement have conductor means coupled to the microstrip transmission line means at the high impedance end forming an input and an output for the helical filter arrangement. The microstrip transmission line means, in combination with the associated capacitors, provide the desired impedance match of the end-positioned resonators to the circuit to which the filter is intended to operate. In addition, the associated capacitors provide temperature compensation for the helical arrangement as a whole, as well as specifically determining the selected frequency range of such filter.

These and other objects of the present invention will become apparent to those skilled in the art upon consideration of the accompanying specification, claims, and drawings.

BRIEF DESCRIPTION OF THE DRAWINGS

Referring to the drawings, wherein like reference numerals identify like elements in the several figures and in which:

FIG. 1b is the corresponding schematic diagram of the helical filter of FIG. 1a.

FIG. 2c is the corresponding schematic diagram of the filter of FIG. 2a.

DETAILED DESCRIPTION

Figure 1A:
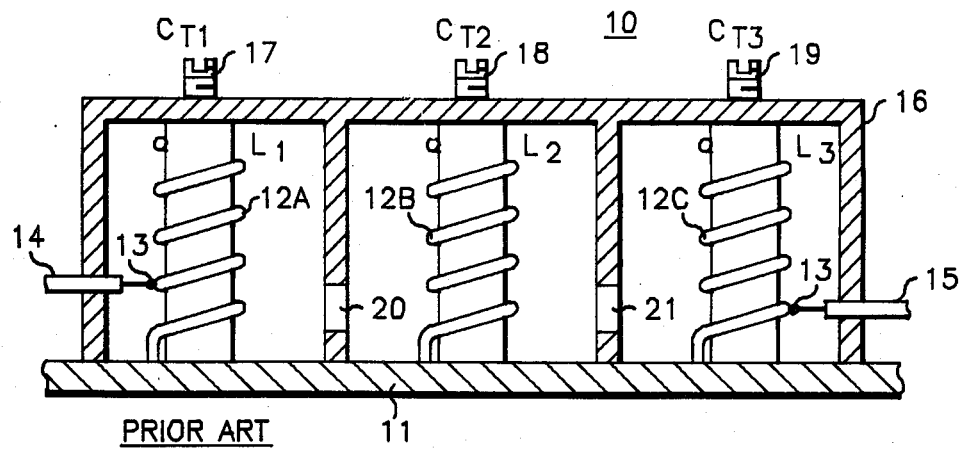
FIG. 1a is a pictorial diagram of a typical helical filter arrangement to be found in the prior art.
Figure 1B:
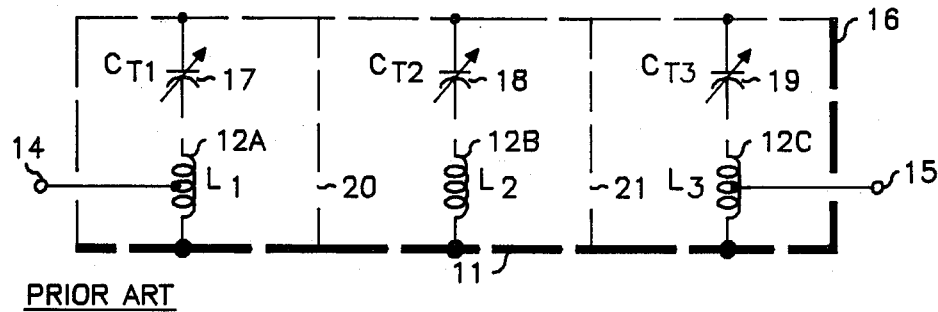

Referring now to the drawings, a bandpass helical filter arrangement 10 is shown in FIG. 1 which may be taken as typical of the prior art. FIG. 1a shows the filter in pictorial form and the corresponding schematic diagram thereof is shown in FIG. 1b.

In the prior art as depicted, the helical filter 10 consists of a ground plane 11 having one or more helical resonator coils such as shown at 12A, 12B, and 12C which are electrically connected to this ground plane. The resonator coils often consist of a conductor or helical resonator wound on an insulating cylindrical form. However, the end of coils 12A, 12C customarily include a tap point, such as at 13, which provides the necessary impedance transformation for the input and output connections, 14 and 15. A housing 16 encloses the entire helical filter arrangement so as to provide an associated distributed capacitance and has tuning screws 17-19 (corresponding to $CT_1$, $CT_2$, and $CT_3$ in FIGS. 1a and 1b), for varying the associated distributed capacitance for each resonator. The housing also has apertures 20, 21 for allowing a predetermined value of coupling to exist between adjacent resonators.

This filter arrangement 10 is subject to all of the previously enumerated deficiencies set forth with some particularity in the background of the invention. That is, it is uncompensated with respect to temperature and there is but one set frequency range within which the filter may operate.

Figure 2A:
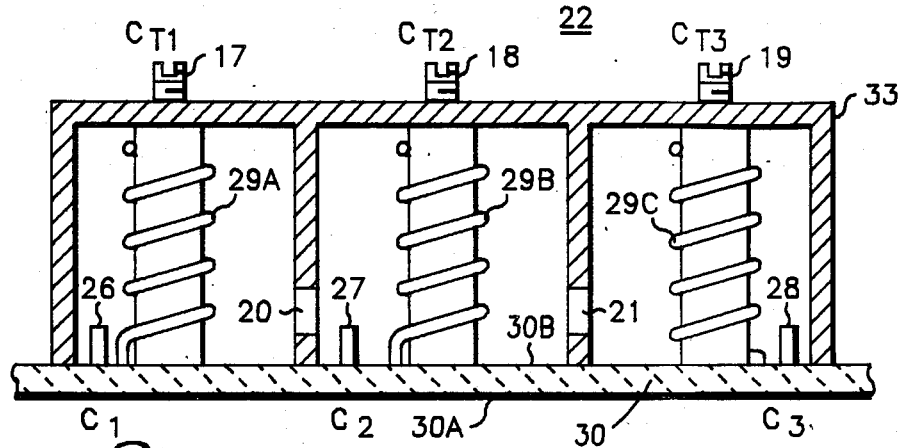
FIG. 2a is a pictorial diagram of the preferred embodiment of the improved helical filter in accordance with the present invention.
Figure 2B:
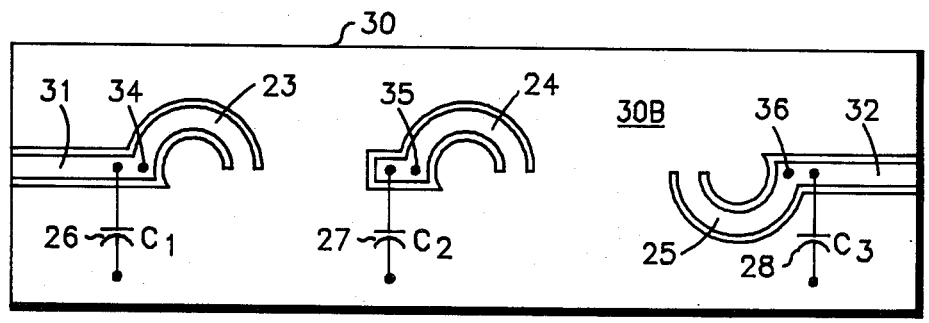
FIG. 2b is a graphic representation of the ground plane of the filter of FIG. 2a showing associated microstrip transmission lines and discrete capacitors.
Figure 2C:
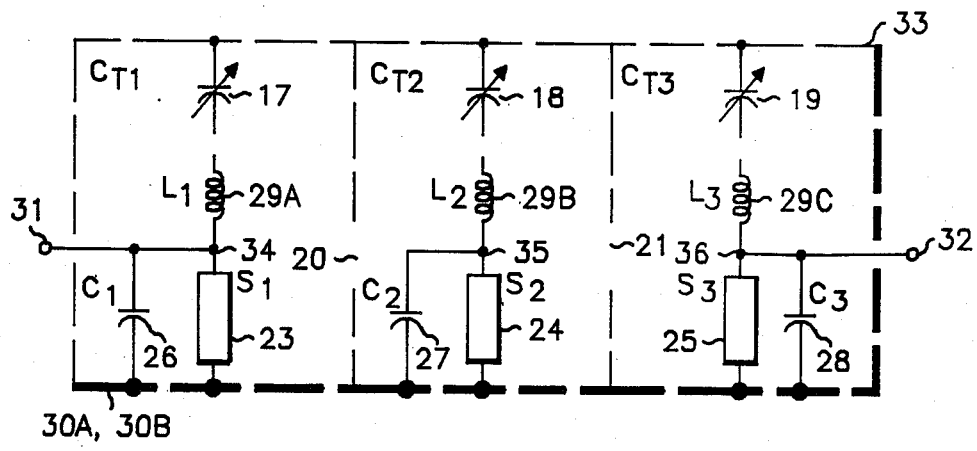

A preferred embodiment of the helical filter of the present invention depicted at 22 is shown in FIG. 2a. The pictorial representations thereof are shown in FIGS. 2a and 2b, while the full schematic diagram is illustrated in FIG. 2c. In this embodiment, the ground plane 30 consists of a printed circuit board having a first conductive surface 30A shown on the exterior in FIG. 2a, and a number of microstrip transmission lines 23-25 formed within conductive surface 30B (best seen in FIG. 2b). Each microstrip transmission line is interconnected in parallel with a respective one of the discrete capacitors 26-28 also shown in FIGS. 2b and 2c. In addition, there is a provision to electrically connect a respective one of the resonator coils 29A, 29B, 29C at points 34-36, respectively. Thus, the helical coils no longer require a tap point manufactured on the coil itself. As such they are essentially identical. The required impedance transformation between the helical resonator and an input/output connection formerly provided by conventionally tapped coils is now accomplished by means of the combined reactances of the transmission line-capacitor pair. That is, the transmission line provides inductive reactance and the capacitor provides capacitive reactance. As a result, the filter is conveniently and effectively temperature compensated by the selection of capacitors 26-28 having the appropriate temperature characteristics. Furthermore, these capacitors facilitate changing frequency bands by simple substitution of a new value without having to modify either the resonator coils or the transmission line length on the printed circuit board, 30.

A housing, 33 see FIGS. 2a, 2c, encloses the entire helical filter arrangement providing an associated distributed capacitance for each resonator and includes tuning screws 17-19 for varying this capacitance. The housing also has apertures 20, 21 for allowing a predetermined value of coupling to exist between adjacent resonators. This housing is similar to most typical helical filter housings, with the notable exception that the provisions for the input and output connections are no longer necessary. As shown in FIG. 2b and 2c, the input and output connections are now accomplished by means of conductors 31, 32 on the conductive surface 30B of the ground plane printed circuit board 30 instead of in the form of coaxial cable mounted through the housing. Thus, the present invention simplifies the housing as well as the way in which the input/output connections are made.

In summary, the bandpass helical filter arrangement permits the construction of an improved, yet simplified, filter using one type of helical coil without the need for a tap point. In addition, this filter arrangement not only simplifies the structure of the filter but also provides flexibility in temperature compensation and frequency range changes, thus overcoming the limitations of the known prior art.

Although the bandpass helical filter arrangement of the present invention fully discloses many of the attendant advantages, it is understood that various changes and modifications are apparent to those skilled in the art. Therefore, even though the form of the above-described invention is merely a preferred or exemplary embodiment, variations may be made in the form, construction, and arrangement of the parts without departing from the scope of the above invention.

I claim:

1. An improved, temperature compensated, bandpass helical filter arrangement exhibiting a given input impedance and a given output impedance and wherein the frequency range of interest of the filter may be changed as desired, said filter arrangement including in combination:

a modified ground plane having a dielectric layer with a plurality of segments formed thereon, each segment forming microstrip transmission line means configured to have a low impedance end and a high impedance end;

a plurality of helical resonators, each helical resonator having one end thereof coupled to the high impedance end of a respective one of said microstrip transmission line means;

a plurality of capacitor means, each capacitor means respectively connected in parallel with an associated one of said microstrip transmission line means between the high impedance end and low impedance end thereof; and conductor means coupled to at least two of said microstrip transmission line means at the high impedance ends, respectively forming an input and an output for said helical filter arrangement, said capacitor means providing temperature compensation for said helical filter arrangement and said microstrip transmission line means having an electrical length less than one-quarter wavelength for the frequency range and having a configuration predetermined in accordance with a thickness and dielectric constant associated with the dielectric layer of the modified ground plane for providing an inductive impedance, which, in combination with said capacitor means, provides combined reactances to effect a desired impedance match to said helical resonators from the input or the output, as well as further determining the selected frequency range of the filter.

2. A helical filter arrangement according to claim 1, wherein said modified ground plane comprises a printed circuit board with said microstrip transmission line means being provided in the form of conductors configured on an external side of said printed circuit board facing away from said helical resonators.

3. A helical filter arrangement according to claim 1, wherein said modified ground plane comprises a printed circuit board with said microstrip transmission line means being provided in the form of conductors configured on an internal side of said printed circuit board facing towards said helical resonators.

4. A helical filter arrangement according to claim 1, further including a conductive housing configured with a plurality of compartments for housing respective individual ones of said resonators, and wherein said compartments include apertures for controlling an amount of coupling between adjacent compartments.

5. A helical filter arrangement according to claim 4, wherein said helical resonators include helical coils, with each coil exhibiting an associated distributed capacitance to a respective resonator compartment.

6. A helical filter arrangement according to claim 5, further having a plurality of tuning capacitor means consisting of screws threaded through said housing, axially above each respective helical coil, for varying said associated distributed capacitance.

7. A helical filter arrangement according to claim 1, wherein said capacitor means mount on said modified ground plane and are facing externally away from said helical resonators.

8. A helical filter arrangement according to claim 1, wherein said capacitor means mount on said modified ground plane and are facing internally towards said helical resonators.

9. A helical filter arrangement according to claim 1, wherein said conductor means consists of two conductors mounted on an external side of said modified ground plane and are facing away from said helical resonators, for coupling to at least two of said microstrip transmission line means and for providing an input and an output for said helical filter arrangement.

10. A helical filter arrangement according to claim 1, wherein said conductor means consists of two conductors on an internal side of said modified ground plane and are facing towards said helical resonators, for coupling to at least two of said microstrip transmission line means and for providing an input and an output for said helical filter arrangement.

11. An improved, temperature-compensated, bandpass helical filter arrangement exhibiting a given input impedance and a given output impedance and wherein the frequency range of interest of the filter may be changed as desired, said filter arrangement including in combination:

a modified ground plane comprising a printed circuit board with a dielectric layer which includes a plurality of microstrip transmission lines in the form of semi-circular conductors formed on a first conductive surface thereof, said semi-circular conductors exhibiting an inductive reactance and having a low impedance end and a high impedance end;

a plurality of helical resonators, each helical resonator having one end thereof electrically connected to the high impedance end of a respective one of said microstrip transmission lines and mounted on a second conductive surface of said printed circuit board;

a conductive housing configured with resonator compartments housing associated helical resonators and effecting an associated distributed capacitance to said associated helical resonators, and wherein said housing includes associated apertures for coupling between adjacent compartments, and said housing further includes tuning screws threaded through said housing, axially above each respective helical resonator for varying said associated distributed capacitance;

a plurality of discrete capacitors, each discrete capacitor connected in parallel with an associated one of said microstrip transmission lines and mounted on the second conductive surface of said printed circuit board facing internally towards each associated compartment; and conductor means formed on the first conductive surface of said printed circuit board and connected to a given two of said microstrip transmission lines at the high impedance ends to respectively form an input and an output for said helical filter arrangement, said discrete capacitors providing temperature compensation for said helical filter arrangement and said microstrip transmission lines having an electrical length less than one-quarter wavelength for the frequency range and having a configuration predetermined in accordance with a set of dielectric characteristics associated with the dielectric layer of the modified ground plane for providing an inductive impedance, which, in combination with said discrete capacitors, provides combined reactances to effect a desired impedance match to said helical resonators from the input or the output, as well as further determining the selected frequency range of the filter.

12. A bandpass helical filter arrangement according to claim 11, wherein:

there are at least three of said helical resonators, each helical resonator connected to a respective microstrip transmission line on said printed circuit board; and said plurality of discrete capacitors consists of three capacitors.

13. A bandpass helical filter arrangement according to claim 12 wherein said conductor means includes two runners on said printed circuit board connected to a given two of said microstrip transmission lines at the high impedance ends to respectively form an input and an output for said helical filter arrangement.

* * * * *